(12) United States Patent
Zhao

(10) Patent No.: US 11,676,944 B2
(45) Date of Patent: *Jun. 13, 2023

(54) METHOD FOR INTERCONNECTING STACKED SEMICONDUCTOR DEVICES

(71) Applicant: Intel Corporation, Santa Clara, CA (US)

(72) Inventor: Junfeng Zhao, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 17 days.

This patent is subject to a terminal disclaimer.

(21) Appl. No.: 17/246,982

(22) Filed: May 3, 2021

(65) Prior Publication Data
US 2021/0327853 A1 Oct. 21, 2021

Related U.S. Application Data

(63) Continuation of application No. 16/852,747, filed on Apr. 20, 2020, now Pat. No. 11,024,607, which is a
(Continued)

(51) Int. Cl.
*H01L 25/065* (2023.01)
*H01L 25/00* (2006.01)
(Continued)

(52) U.S. Cl.
CPC .......... *H01L 25/0657* (2013.01); *H01L 24/19* (2013.01); *H01L 24/96* (2013.01);
(Continued)

(58) Field of Classification Search
CPC ................. H01L 25/0657; H01L 25/50; H01L 2225/06544; H01L 25/00; H01L 24/19;
(Continued)

(56) References Cited

U.S. PATENT DOCUMENTS 9,627,358 B2 4/2017 Zhao
9,899,354 B2 2/2018 Zhao
(Continued)

FOREIGN PATENT DOCUMENTS

CN 101681903 A 3/2010
CN 101866915 A 10/2010
(Continued)

OTHER PUBLICATIONS

US 9,543,272 B2, 01/2017, Zhao et al. (withdrawn)
(Continued)

*Primary Examiner* — Caleen O Sullivan
(74) *Attorney, Agent, or Firm* — Schwegman Lundberg & Woessner, P.A.

(57) ABSTRACT

A method for making a semiconductor device includes forming rims on first and second dice. The rims extend laterally away from the first and second dice. The second die is stacked over the first die, and one or more vias are drilled through the rims after stacking. The semiconductor device includes redistribution layers extending over at least one of the respective first and second dice and the corresponding rims. The one or more vias extend through the corresponding rims, and the one or more vias are in communication with the first and second dice through the rims.

25 Claims, 7 Drawing Sheets

Related U.S. Application Data continuation of application No. 15/861,288, filed on Jan. 3, 2018, now Pat. No. 10,643,975, which is a continuation of application No. 15/401,921, filed on Jan. 9, 2017, now Pat. No. 9,899,354, which is a continuation of application No. 14/368,774, filed as application No. PCT/CN2013/084498 on Sep. 27, 2013, now Pat. No. 9,627,358.

(51) Int. Cl.
  *H01L 23/00* (2006.01)
  *H01L 21/56* (2006.01)
  *H01L 21/50* (2006.01)
  *H01L 23/498* (2006.01)

(52) U.S. Cl.
  CPC .............. *H01L 25/00* (2013.01); *H01L 25/50* (2013.01); *H01L 21/50* (2013.01); *H01L 21/565* (2013.01); *H01L 23/49816* (2013.01); *H01L 2224/12105* (2013.01); *H01L 2224/32145* (2013.01); *H01L 2224/48091* (2013.01); *H01L 2224/48145* (2013.01); *H01L 2224/48227* (2013.01); *H01L 2224/73217* (2013.01); *H01L 2224/73265* (2013.01); *H01L 2224/73267* (2013.01); *H01L 2224/8203* (2013.01); *H01L 2224/82039* (2013.01); *H01L 2224/82047* (2013.01); *H01L 2224/92144* (2013.01); *H01L 2225/0651* (2013.01); *H01L 2225/06506* (2013.01); *H01L 2225/06544* (2013.01); *H01L 2225/06548* (2013.01); *H01L 2225/06562* (2013.01); *H01L 2924/00014* (2013.01); *H01L 2924/12042* (2013.01); *H01L 2924/15311* (2013.01); *H01L 2924/181* (2013.01)

(58) Field of Classification Search
  CPC ........... H01L 24/96; H01L 2924/15311; H01L 2225/06506; H01L 2225/0651; H01L 2225/06548; H01L 2224/8203; H01L 23/49816; H01L 21/50; H01L 2224/32145; H01L 2224/82039; H01L 2924/00014; H01L 2224/92144; H01L 21/565
  USPC .......................... 257/774; 438/781; 156/245
  See application file for complete search history.

(56) References Cited

U.S. PATENT DOCUMENTS

| | | |
|---|---|---|
| 10,643,975 B2 | 5/2020 | Zhao |
| 11,024,607 B2 | 6/2021 | Zhao |
| 2006/0189036 A1 | 8/2006 | Clyne et al. |
| 2008/0308921 A1 | 12/2008 | Kim |
| 2009/0014876 A1 | 1/2009 | Youn et al. |
| 2009/0134528 A1 | 5/2009 | Lee et al. |
| 2009/0260228 A1 | 10/2009 | Val |
| 2009/0317944 A1 | 12/2009 | Kim |
| 2010/0193930 A1 | 8/2010 | Lee |
| 2010/0246141 A1 | 9/2010 | Leung et al. |
| 2010/0265751 A1 | 10/2010 | Hong |
| 2011/0291246 A1 | 12/2011 | Jo et al. |
| 2012/0049376 A1 | 3/2012 | Harada et al. |
| 2012/0299191 A1 | 11/2012 | Camacho |
| 2013/0154106 A1 | 6/2013 | Hu et al. |
| 2013/0200523 A1 | 8/2013 | Sawachi et al. |
| 2015/0325550 A1 | 11/2015 | Zhao |
| 2017/0179082 A1 | 6/2017 | Zhao |
| 2018/0145055 A1 | 5/2018 | Zhao |
| 2021/0005577 A1 | 1/2021 | Zhao |

FOREIGN PATENT DOCUMENTS

| | | |
|---|---|---|
| CN | 102263084 A | 11/2011 |
| CN | 104517934 A | 4/2015 |
| DE | 602008002200 | 9/2010 |
| DE | 102014113299 A1 | 4/2015 |
| EP | 2053646 A1 | 4/2009 |
| FR | 2923081 A1 | 5/2009 |
| GB | 14170609 B | 1/2018 |
| JP | 2003163324 A | 6/2003 |
| JP | 2009027068 A | 2/2009 |
| JP | 2009111384 A | 5/2009 |
| JP | 2012253392 A | 12/2012 |
| JP | 2013162071 A | 8/2013 |
| JP | 2017224847 A | 12/2017 |
| JP | 6961885 | 10/2021 |
| KR | 20080111228 A | 12/2008 |
| KR | 1020090055316 A | 6/2009 |
| KR | 20090007120 U | 7/2009 |
| KR | 1020100114421 A | 10/2010 |
| KR | 20110107989 A | 10/2011 |
| KR | 20130105819 A | 9/2013 |
| KR | 102052255 B1 | 12/2019 |
| RU | 2461911 C2 | 9/2012 |
| RU | 2664894 C1 | 8/2018 |
| TW | 200941686 A | 10/2009 |
| TW | 201230290 A | 7/2012 |
| TW | 201532156 A | 8/2015 |
| TW | I573206 B | 3/2017 |
| WO | WO-2006027981 A1 | 3/2006 |
| WO | WO-2010111825 A1 | 10/2010 |
| WO | WO-2015042886 A1 | 4/2015 |

OTHER PUBLICATIONS

US 9,589,934 B2, 03/2017, Zhao (withdrawn)
"U.S. Appl. No. 14/368,774, Corrected Notice of Allowance dated Feb. 7, 2017", 4 pgs.
"U.S. Appl. No. 14/368,774, Corrected Notice of Allowance dated Mar. 17, 2017", 4 pgs.
"U.S. Appl. No. 14/368,774, Non Final Office Action dated Mar. 10, 2016", 10 pgs.
"U.S. Appl. No. 14/368,774, Notice of Allowance dated Aug. 30, 2016", 8 pgs.
"U.S. Appl. No. 14/368,774, Preliminary Amendment filed Jun. 25, 2014", 3 pgs.
"U.S. Appl. No. 14/368,774, Response filed Jan. 18, 2016 to Restriction Requirement dated Nov. 17, 2018", 6 pgs.
"U.S. Appl. No. 14/368,774, Response filed Aug. 10, 2016 to Non Final Office Action dated Mar. 10, 2016", 16 pgs.
"U.S. Appl. No. 14/368,774, Restriction Requirement dated Nov. 17, 2015", 5 pgs.
"U.S. Appl. No. 15/401,921, Non Final Office Action dated Jun. 6, 2017", 6 pgs.
"U.S. Appl. No. 15/401,921, Notice of Allowance dated Sep. 27, 2017", 7 pgs.
"U.S. Appl. No. 15/401,921, Preliminary Amendment filed Mar. 13, 2017", 18 pgs.
"U.S. Appl. No. 15/401,921, Response filed Sep. 5, 2017 to Non Final Office Action dated Jun. 6, 2017", 9 pgs.
"U.S. Appl. No. 15/861,288, Non Final Action dated Mar. 15, 2018", 6 pgs.
"U.S. Appl. No. 15/861,288, Notice of Allowance dated Jan. 8, 2020", 7 pgs.
"U.S. Appl. No. 15/861,288, Notice of Allowance dated Apr. 19, 2019", 7 pgs.
"U.S. Appl. No. 15/861,288, Notice of Allowance dated Aug. 27, 2019", 7 pgs.
"U.S. Appl. No. 15/861,288, Response filed Jul. 16, 2018 to Non Final Office Action dated Mar. 15, 2018", 8 pgs.
"U.S. Appl. No. 16/852,747, Non Final Office Action dated Oct. 15, 2020".
"U.S. Appl. No. 16/852,747, Notice of Allowance dated Feb. 2, 2021", 7 pgs.

(56) References Cited

OTHER PUBLICATIONS

"U.S. Appl. No. 16/852,747, Preliminary Amendment filed Sep. 24, 2020", 7 pgs.
"U.S. Appl. No. 16/852,747, Response filed Jan. 15, 21 to Non Final Office Action dated Oct. 15, 2020", 8 pgs.
"Brazilian Application Serial No. 112016004369-3, Office Action dated Mar. 19, 2020", With English translation, 6 pages.
"Brazilian Application Serial No. 112016004369-3, Response filed Aug. 31, 2020 to Office Action dated Mar. 19, 2020", With English translation, 74 pages.
"Brazilian Application Serial No. BR122017018407-5, Office Action dated Jun. 12, 2020", With English translation, 9 pages.
"Brazilian Application Serial No. BR122017018407-5, Response filed Sep. 23, 2020 to Office Action dated Jun. 12, 2020", With English translation, 74 pages.
"Chinese Application Serial No. 201410504407.8, Office Action dated Dec. 15, 2016", With English translation, 31 pages.
"Chinese Application Serial No. 201410504407.8, Response filed Apr. 26, 2017 to Office Action dated Dec. 15, 2016", With English claims, 14 pages.
"Chinese Application Serial No. 201710678886.9, Decision of Rejection dated Nov. 24, 2020", With English translation, 12 pages.
"Chinese Application Serial No. 201710678886.9, Office Action dated Mar. 5, 2020", With English translation, 21 pages.
"Chinese Application Serial No. 201710678886.9, Office Action dated Jul. 23, 2019", With English translation, 17 pages.
"Chinese Application Serial No. 201710678886.9, Office Action dated Aug. 10, 2020", With English translation, 21 pages.
"Chinese Application Serial No. 201710678886.9, Response filed May 20, 2020 to Office Action dated Mar. 5, 2020", With English claims, 13 pages.
"Chinese Application Serial No. 201710678886.9, Response filed Oct. 26, 2020 to Office Action dated Aug. 10, 2020", With English claims, 14 pages.
"Chinese Application Serial No. 201710678886.9, Response filed Dec. 9, 2019 to Office Action dated Jul. 23, 2019", With English claims, 7 pages.
"European Application Serial No. 13894419.4, Extended European Search Report dated Apr. 26, 2017", With English translation, 7 pages.
"Germany Application Serial No. 102014113299.8, Office Action dated May 20, 2015", With English translation, 8 pages.
"Germany Application Serial No. 102014113299.8, Response filed Sep. 17, 2015 to Office Action dated May 20, 2015", With English claims, 18 pages.
"International Application Serial No. PCT/CN2013/084498, International Preliminary Report on Patentability dated Jan. 19, 2016", 13 pgs.
"International Application Serial No. PCT/CN2013/084498, International Search Report dated Jun. 30, 2014", 5 pgs.
"International Application Serial No. PCT/CN2013/084498, Written Opinion dated Jun. 30, 2014", 7 pgs.
"Japanese Application Serial No. 2016-533775, Office Action dated Mar. 21, 2017", With English translation, 13 pages.
"Japanese Application Serial No. 2016-533775, Office Action dated Aug. 7, 2018", With English translation, 7 pages.
"Japanese Application Serial No. 2016-533775, Office Action dated Dec. 26, 2017", With English Translation, 12 pages.
"Japanese Application Serial No. 2016-533775, Response filed Aug. 16, 2017 to Office Action dated Mar. 21, 2017", With English translation, 43 pages.
"Japanese Application Serial No. 2017-157232, Examiners Decision of Final Refusal dated Feb. 26, 2019", With English translation, 9 pages.
"Japanese Application Serial No. 2017-157232, Final Notification of Reasons for Refusal dated Mar. 23, 2021", With English translation, 16 pages.
"Japanese Application Serial No. 2017-157232, Notification of Reasons for Refusal dated Sep. 23, 2020", With English translation, 12 pages.

"Japanese Application Serial No. 2017-157232, Office Action dated Apr. 24, 2018", With English translation, 9 pages.
"Japanese Application Serial No. 2017-157232, Office Action dated Sep. 4, 2019", With English claims, 3 pages.
"Japanese Application Serial No. 2017-157232, Reconsideration Report by Examiner before Appeal, dated Aug. 9, 2019", With English translation, 18 pages.
"Japanese Application Serial No. 2017-157232, Response filed Sep. 25, 2018 to Office Action dated Apr. 24, 2018", With English claims, 17 pages.
"Japanese Application Serial No. 2017-157232, Response filed Oct. 1, 2019 to Office Action dated Sep. 4, 2019", With English claims, 10 pages.
"Japanese Application Serial No. 2017-157232, Response filed Nov. 11, 2020 to Notification of Reasons for Refusal dated Sep. 23, 2020", With English claims, 13 pages.
"Korean Application Serial No. 10-2017-7032450, Notice of Preliminary Rejection dated Nov. 1, 2018", With English translation, 24 pages.
"Korean Application Serial No. 10-2017-7032450, Office Action dated Jun. 26, 2019", With English translation, 6 pages.
"Korean Application Serial No. 10-2017-7032450, Response filed Feb. 1, 2019 to Notice of Preliminary Rejection Nov. 1, 2018", With English translation, 44 pages.
"Korean Application Serial No. 2016-7004985, Final Office Action dated Sep. 28, 2017", With English translation, 12 pages.
"Korean Application Serial No. 2016-7004985, Office Action dated Feb. 13, 2017", With English translation, 18 pages.
"Korean Application Serial No. 2016-7004985, Response filed Apr. 13, 2017 to Office Action dated Feb. 13, 2017", With English claims, 32 pages.
"Russian Application Serial No. 2016106996, Office Action dated Jan. 18, 2017", With English translation, 17 pages.
"Russian Application Serial No. 2016106996, Response filed Apr. 7, 2017 to Office Action dated Jan. 18, 2017", With English claims, 10 pages.
"Taiwanese Application Serial No. 103133278, Office Action dated May 26, 2016", With English translation, 22 pages.
"Taiwanese Application Serial No. 103133278, Response filed Aug. 29, 2016 to Office Action dated May 26, 2016", With English claims, 25 pages.
"Taiwanese Application Serial No. 105140663, Office Action dated Jun. 30, 2017", With English translation, 16 pages.
"Taiwanese Application Serial No. 105140663, Response filed Apr. 7, 2017 to Non Final Office Action dated Dec. 8, 2016", With English translation, 36 pages.
"Taiwanese Application Serial No. 105140663, Response filed Jan. 2, 2018 to Office Action dated Jun. 30, 2017", With English claims, 15 pages.
"United Kingdom Application Serial No. 1417060.9, Combined Search and Examination Report dated Mar. 16, 2015", 7 pgs.
"United Kingdom Application Serial No. 1417060.9, Office Action dated Mar. 29, 2016", 3 pgs.
"United Kingdom Application Serial No. 1417060.9, Office Action dated Apr. 19, 2017", 3 pgs.
"United Kingdom Application Serial No. 1417060.9, Office Action dated Oct. 30, 2015", 2 pgs.
"United Kingdom Application Serial No. 1417060.9, Response filed May 31, 2016 to Office Action dated Mar. 29, 2016", 17 pgs.
"United Kingdom Application Serial No. 1417060.9, Response filed Sep. 25, 2015 to Combined Search and Examination Report dated Mar. 16, 2015", 17 pgs.
"United Kingdom Application Serial No. 1417060.9, Response filed Dec. 30, 2015 to Office Action dated Oct. 30, 2015", 11 pgs.
"United Kingdom Application Serial No. 1417060.9, Response filed Jun. 19, 2017 to Office Action dated Apr. 19, 2017", w/ English Translation, 17 pgs.
"Chinese Application Serial No. 201710678886.9, Notice of Reexamination dated May 31, 2021", With English translation, 17 pages.
"Japanese Application Serial No. 2017-157232, Response filed May 19, 2021 to Final Notification of Reasons for Refusal dated Mar. 23, 2021", With English claims, 15 pages.

(56) References Cited

OTHER PUBLICATIONS

"Chinese Application Serial No. 201710678886.9, Response filed Jul. 15, 2021 to Notice of Reexamination dated May 31, 2021", with English claims, 20 pages.
"German Application Serial No. 102014019977.0, Office Action dated Nov. 18, 2021", With English machine translation, 10 pgs.
"German Application Serial No. 102014019977.0, Response filed May 18, 2022 to Office Action dated Nov. 18, 2021", w English claims, 33 pgs.
"German Application Serial No. 102014113299.8, Office Action dated Mar. 21, 2023", With English machine translation, 13 pgs.

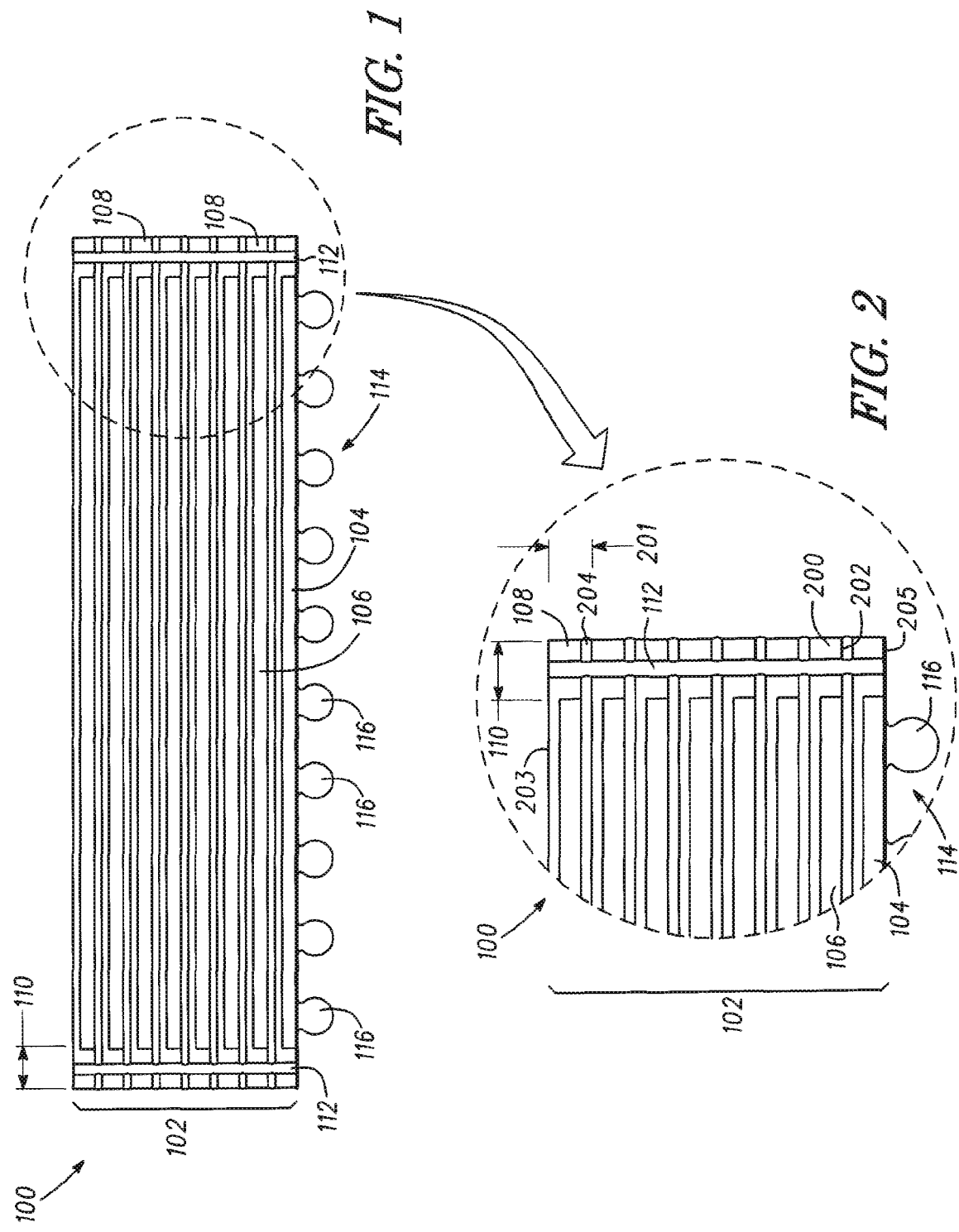

|  | | SDP(1) | DDP(2) | QDP(4) | ODP(8) | HDP(16) |
|---|---|---|---|---|---|---|
| WIRE BONDED SEMICONDUCTOR DEVICE | DIE ASSEMBLY Z HEIGHT | 25 | 25 | 25 | 25 | 25 |
|  | MOLD CAP PLUS CLEARANCE Z HEIGHT PER DIE ASSEMBLY | 280 | 140 | 70 | 35 | 17.5 |
|  | TOTAL Z HEIGHT OF PACKAGE | 305 | 330 | 380 | 480 | 680 |

|  | | SDP(1) | DDP(2) | QDP(4) | ODP(8) | HDP(16) |
|---|---|---|---|---|---|---|
| SEMICONDUCTOR DEVICE WITH VIAS IN RIMS | DIE ASSEMBLY Z HEIGHT | 25 | 25 | 25 | 25 | 25 |
|  | EXEMPLARY MOLDING COMPOUND Z HEIGHT ADDITION PER DIE ASSEMBLY | 10 | 10 | 10 | 10 | 10 |
|  | TOTAL Z HEIGHT OF PACKAGE | 35 | 70 | 140 | 280 | 560 |

| Z HEIGHT SAVING REALIZED WITH DIE PACKAGE HAVING VIAS IN RIMS | 270 | 260 | 240 | 200 | 120 |
|---|---|---|---|---|---|

FIG. 6

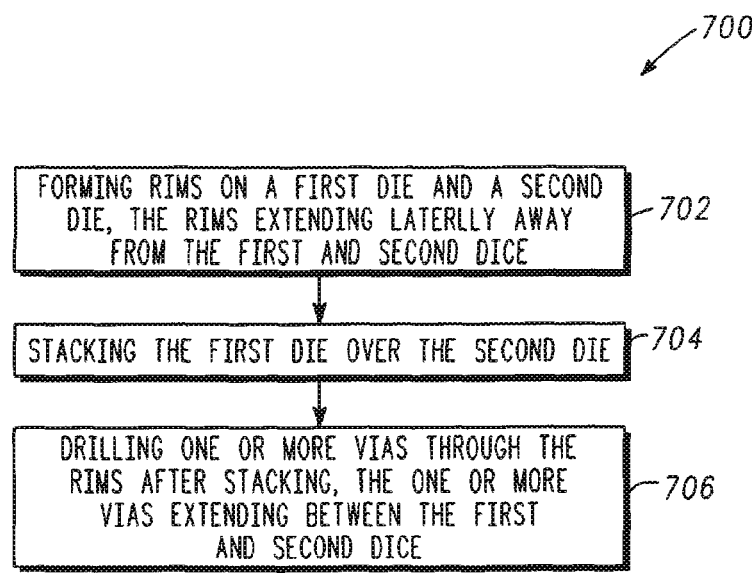

FIG. 7

METHOD FOR INTERCONNECTING STACKED SEMICONDUCTOR DEVICES

PRIORITY

This application is a continuation of U.S. application Ser. No. 16/852,747, filed Apr. 20, 2020, which is a continuation of U.S. application Ser. No. 15/861,288, filed Jan. 3, 2018, which is a continuation of U.S. Application Ser. No. 15/401,921, filed Jan. 9, 2017, which claims priority to U.S. application Ser. No. 14/368,774, filed Jun. 25, 2014, which claims priority to International Application No. PCT/CN2013/084498, filed Sep. 27, 2013, each of which are incorporated herein by reference in their entirety.

TECHNICAL FIELD

Embodiments described herein generally relate to multi-layer fabrication and electrical interconnections in microelectronic devices.

BACKGROUND

Multi-layer semiconductor devices include a plurality of dice stacked and adhered with electrical connections extending therebetween. In one example, the stacked device is formed from two or more wafers (including a plurality of dice therein) that are coupled together at interfaces between the two or more wafers. The coupled wafers are diced and wire bonded to form the plurality of devices.

In some examples, some of the dice (e.g., chips within the dice) of the wafers are defective and unusable. These defective dice are still incorporated into the multi-layered semi-conductor devices by virtue of coupling between the wafers and the resulting devices are also defective and unusable even where many of the other dice within the devices are otherwise fully usable. Accordingly, wafer based fabrication decreases the overall yield of usable multi-layer devices.

In other examples, interconnections between dice within a multi-layered semi-conductor device are provided through wirebonding between the various layers. For instance, two or more semiconductor dice are stacked (e.g., adhered) on a substrate and electrical wires extend along the wire bond pads of the semi-conductor dice to the substrate. On the substrate the electrical interconnections are further routed to the ball grid arrays on the other side of the substrate. The stacked semiconductor dice are molded to protect both the dice and the electrical wires. The electrical wires provide indirect coupling between two or more layers of the multi-layered device. The indirect coupling between two or more of the layers with bond wires limits data and power transmission (e.g., the speed of data transmission and corresponding performance). Additionally, the introduction of a substrate and mold cap over the stacked dice increases the height (z height) of a multi-layered device.

Improved multi-layer fabrication techniques and faster interconnection techniques between layers are desirable that address these and other technical challenges.

BRIEF DESCRIPTION OF THE DRAWINGS

FIG. 1 is a cross sectional view of a multi-layered semiconductor device including vias extending through rims that laterally extend from the dice.

FIG. 2 is a detailed cross sectional view of the multi-layered semiconductor device of FIG. 1.

FIG. 6 is a table comparing the Z height of a semiconductor device including wire bonding and a semiconductor device including vias within lateral rims.

FIG. 7 is a block diagram showing another example of a method for making a multi-layered semiconductor device.

DESCRIPTION OF EMBODIMENTS

Figure 3:
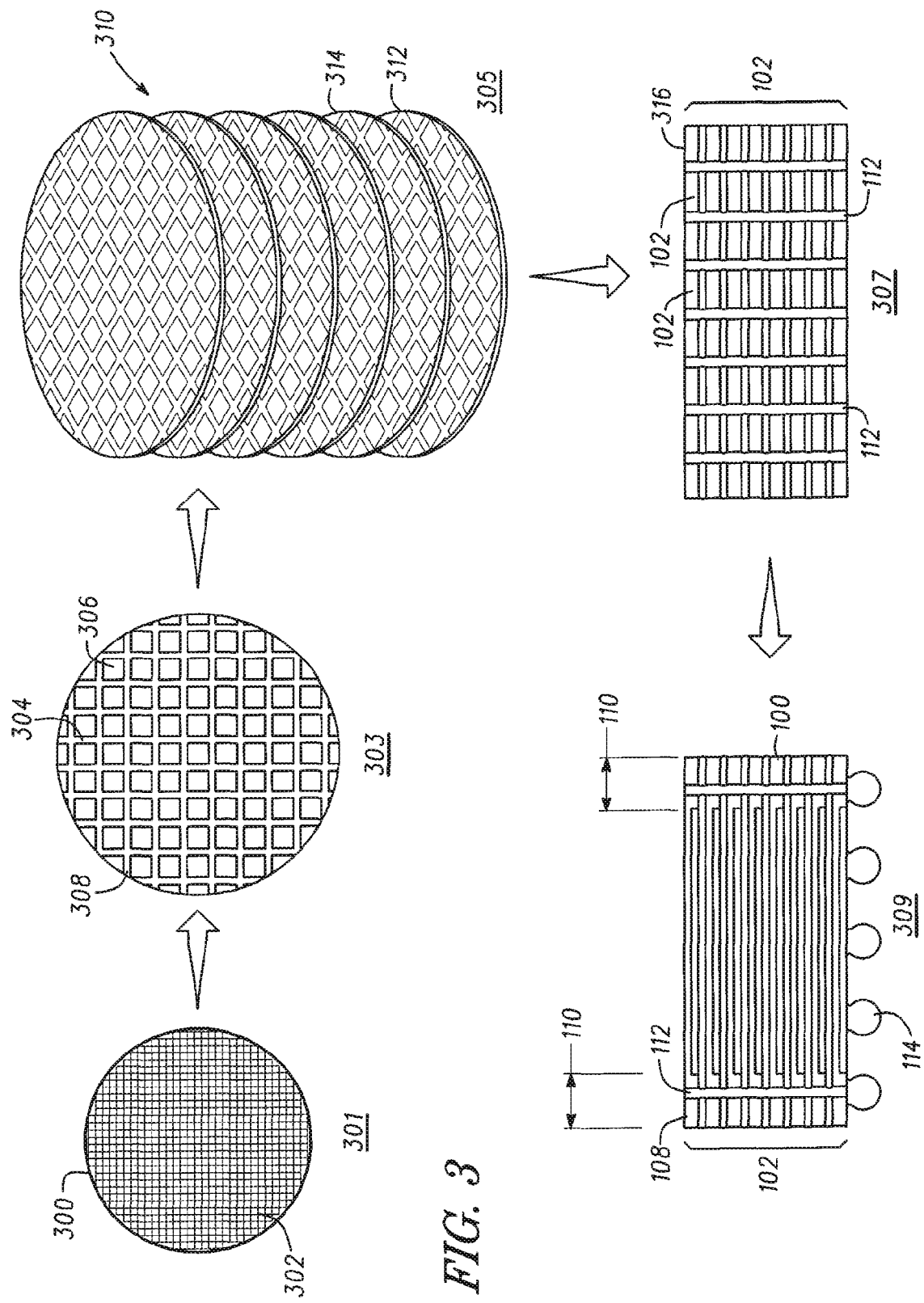
FIG. 3 is a process flow diagram showing one example of a method for making a multi-layered semiconductor device.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

FIG. 1 shows one example of a semiconductor device 100 including a plurality of dice 102. As shown for instance in FIG. 1 the semiconductor device 100 includes at least a first die and a second die 104, 106. As shown the first and second dice 104, 106 are coupled along upper and lower surfaces of the respective dice. As further shown in FIG. 1, the semiconductor device 100 includes one or more rims 108 extending laterally, for instance according to a rim lateral extension 110 dimension from each of the dice 102. In an example, as shown with regard to the first and second dice 104, 106 the respective rims 108 extend laterally away from the corresponding edges of the first and second dice 104, 106.

In one example, the rims 108 are constructed with but not limited to a polymer material, such as a dielectric molding compound configured to mold around the first and second dice 104, 106 and accordingly protect the dice therein. In another example, the first and second dice 104, 106 are constructed with but not limited to harder materials than the molding compound used in the rims 108. For instance, the first and second dice 104, 106 are constructed with silicon. In another example, the rims 108 are constructed with a softer polymer (e.g., a lower elastic modulus) configured to protect the first and second dice 104, 106 of the semiconductor device 100. The softer polymer of the rims 108 is easier to cut through as described herein (e.g., laser drill, mechanically drill, FIB removal, etch or the like)

Referring again to FIG. 1, as shown a plurality of vias 112 extend through one or more of the dice 102. As will be described herein, the conductive vias 112 allow for communication and data transfer between each of the dice 102 as well as external circuitry including, but not limited to, a ball grid array 114, a land grid array, a pin grid array or the like positioned along a surface of the semiconductor device 100. As shown in the cross-sectional view of FIG. 1, a plurality of vias 112 are formed through the rims 108 as opposed to the first and second dice 104, 106. As will be described herein, the vias 112 are in one example formed after stacking of the dice 102 into the configuration shown in FIG. 1. For instance, the vias 112 are drilled into the rims 108 for instance with one or more mechanical, chemical (lithography), or laser drilling methods.

As will be further described herein, each of the dice 102 in one example includes a redistribution layer, for instance a patterned series of conductive traces provided adjacent to each of the dice 102. The redistribution layer extends over a footprint of the dice 102 and into the rims 108. The conductive traces formed along the redistribution layer are configured for coupling with the vias 112. Accordingly each of the dice 102 of the semiconductor device 100 is able to communicate through the vias 112 with one or more of the other dice 102 and optionally with the ball grid array 114. By providing rims 108 for each of the dice 102 and corresponding vias 112 therein direct coupling between one or more of the dice 102 and the ball grid array 114 is accomplished in contrast to otherwise indirect couplings provided by wire bonding with one or more dice covered in a mold cap (sized to encapsulate free wires), and an underlying substrate with a ball grid array. That is to say, in one example the rims 108 extending from the plurality of dice 102 (e.g., according to the dimension of the rim lateral extension 110) provide a mechanism for compactly receiving a plurality of vias 112 therein that allow for the direct communication between the dice 102 of the semiconductor device 100 without otherwise requiring a molded cap overlying wire bonds of the plurality of dice 102 and a substrate to or the like provide such communication. Accordingly, the height of the semiconductor device 100 (e.g., a Z height) is substantially less than the height of a semiconductor device including a plurality of dice interconnected with wire bonding and then encapsulated within a molded cap and having an underlying substrate. For instance, in some examples, the Z height savings for the semiconductor device 100 having the vias 112 provided in the rims 108 may approach 0.2 mm relative to a comparable wire bonded device. Referring again to FIG. 1, as further shown the semiconductor device 100 in one example includes a ball grid array 114 including a plurality of solder balls 116 provided along one or more of the dice 102. In the example shown in FIG. 1, the first die 104 (e.g., the redistribution layer of the first die 104 described herein) is directly coupled with the solder balls 116. Accordingly, the data transfer for each of the dice 102 through the vias 112 is correspondingly transmitted to the first die 104 and any of the other dice 102 through the vias 112. Solder balls 116 provided in the ball grid array 114 provide input and output to and from the semiconductor device 100 while at the same time avoiding the need for a substrate underlying the plurality of dice 102 to otherwise receive information and transmit information from a semiconductor device. That is to say, by directly coupling the ball grid array 114 to the redistribution layer of the first die 104 the substrate otherwise used with some semiconductor devices is not needed with the semiconductor device 100 shown in FIG. 1 thereby realizing additional space savings and providing a more compact device. By providing a plurality of vias 112 through the rims 108 along with a ball grid array 114 directly coupled along the first die 104 high speed transmission within (and to and from) the semiconductor device 100 is facilitated while at the same time the overall height of the semiconductor device 100 is minimized.

Referring now to FIG. 2, a more detailed cross-sectional view of the semiconductor device 100 previously shown in FIG. 1 is provided. In the detailed view of FIG. 2, the plurality of dice 102 are shown again in the stacked configuration and each of the dice 102 include a corresponding rim 108 extending laterally, for instance according to a rim lateral extension 110 from the dice 102. In one example, each of the dice 102 is part of a die assembly 201 including the respective die 102, a rim 108 and a redistribution layer 202 as described herein (and optionally a molding compound 200).

As shown in FIG. 2, a via 112 or a plurality of vias is provided through the rims 108 and extends continuously between the dice 102. In another example one or more of the vias 112 extends through one or more of the rims 108 to provide communication between two or more dice 102 of the semiconductor device 100 or between a die 102 and the ball grid array (through the redistribution layer 202). That is to say, the vias 112 provided in the rims 108 extend partially or fully through the stack of die assemblies 201. Other vias 112 provided through the rims 108 extend through two or more of the rims 108 to accordingly provide communication between two or more of the dice 102 of the stacked semiconductor device 100. The vias 112 are in one example drilled from both sides of the rims 108, for instance the upper surface 203 and a bottom surface 205 of the semiconductor device 100. In another example, the plurality of vias 112 are drilled from one or both sides of the semiconductor device 203, 205. In another example, the vias 112 are drilled after stacking. Accordingly, the vias 112 are more easily aligned through the previously stacked dice 102. Drilling is conducted in a single efficient operation that consolidates formation of the vias in a single step as opposed to the formation of multiple separate vias and later stacking and alignment of the vias (e.g., the dice).

As described above, each of the die assemblies 201 includes a die 102 as well as a redistribution layer 202 formed adjacent to the die 102. As shown, the redistribution layer 202 extends beyond the footprint (e.g., the lateral footprint of the die 102) and extends into the rim 108. For instance, in one example the die 102 is encapsulated in a molding compound 200, for instance in a panel frame as described herein. Once received within the panel frame the molding compound 200 is introduced to the panel frame and hardens around each of the dice 102. A patterning technique is used to provide the conductive traces of the redistribution layer 202 along each of the dice 102. As shown for instance in FIG. 2, the redistribution layer 202 accordingly extends laterally from the plurality of dice 102 over and across the plurality of rims 108 of each of the die assemblies 201. The redistribution layer 202 thereby provides a "fan-out" configuration that allows for the distributed interconnection of each of the dice 102 with other dice within the semiconductor device 100 as well as the ball grid array 114 (e.g., by way of the vias 112). Additionally, the fanned out redistribution layer 202 cooperates with the plurality of vias 112 provided through the rims 108 to accordingly minimize the overall height of the semiconductor device 100 while at the same time providing direct connection between each of the dice 102 and corresponding direct connections to the ball grid array 114 underlying the first die 104. The redistribution layer provides conductive traces that extend laterally from the dice that are then interconnected by way of the vias 112. Stated another way, the vias 108 and the redistribution layers 202 provide interconnections that are housed within the rims 108 without requiring a larger mold cap (e.g., used to encapsulate otherwise free wires).

As further shown in FIG. 2, the molding compound 200 (e.g., a dielectric resin that forms a corresponding polymer) is provided laterally and over top of the plurality of dice 102 prior to stacking of the dice. In another example, the molding compound 200 is provided on the sides of the plurality of dice 102 as opposed to along an upper surface of each of the dice 102. The molding compound 200 extends laterally to form the rims 108 having a rim lateral extension 110 relative to the dice 102. As previously described, after molding of the plurality of dice 102 (as described herein in a flat panel having a wafer or panel configuration) the plurality of dice 102 are cut from the panel, tested for their operability and then stacked into the configuration shown in FIG. 2, for instance the stacked configuration of the semiconductor device 100. In another example, the plurality of dice are tested prior to both singulation from an original silicon wafer and formation of a reconstituted dice panel (described herein).

Each of the dice 102 is coupled with one another with a layer of an adhesive 204 or other bonding substance provided between each of the die assemblies 201. As shown in FIG. 2, the adhesive 204 aligns each of the dice 102 and maintains the dice 102 in an aligned configuration. After stacking of the dice 102, in one example the plurality of vias 112 are drilled through the semiconductor device 100 to thereby provide the interconnections between each of the dice 102 by way of the redistribution layers 202 of each of the die assemblies 201.

In another example, the vias 112 are formed separately in each of the die assemblies 201 prior to stacking of the die assemblies in the configuration shown in FIG. 2. Accordingly, the vias 112 are aligned during the stacking procedure to accordingly ensure communication between each of the die assemblies 201 (and the ball grid array 114). In one example, the vias 112 are filled with a conductive material, such as copper or the like, sputtered or provided by vapor deposited to interconnect each of the dice 102 of the semiconductor device 100 as well as connect the dice 102 with the ball grid array 114.

Referring again to FIG. 2, as previously described herein each of the vias 112 are shown within the rims 108 and laterally spaced relative to each of the dice 102. That is to say, the dice 102 are interconnected by way of conductive vias 112 provided through the laterally extending rims 108. By providing interconnections between the dice 102 in the lateral portions of each of the die assemblies 201 the connections between each of the dice 102 as well as the ball grid array 114 are consolidated to the vias 112 as well as to the redistribution layers 202 fanned out from each of the dice 102 (e.g., the lateral rims 108). Accordingly, components of other semiconductor devices such as a conductive substrate provided underneath the stacked dice and a mold cap provided to encapsulate and protect the dice as well as wire bonds between each of the dice and the underlying substrate are accordingly avoided. Instead, with the semiconductor device 100 each of the dice 102 is molded with the molding compound to provide a laterally extending rim 108 for the redistribution layers 202 as well as space for the laterally positioned vias 112. Accordingly, the vertical height or Z height of the semiconductor device 100 is minimized relative to the Z height of other configurations of semiconductor devices using wire bonds and underlying substrates (as well as corresponding molding caps over top of the wire bonds).

Additionally, because the vias 112 are provided through the rims 108 the vias 112 are more easily formed within the semiconductor device 100. For instance, vias in at least some examples are provided through the silicon of the dice 102. Silicon is more difficult to drill through because it is brittle and harder (e.g., has a higher elastic modulus). However, the polymer used in the molding compound 200 of the semiconductor device 100 provides a softer material (relative to silicon) for ready drilling of each of the vias 112. The softer material of the rims 108 accordingly ensures the vias 112 are easily formed in the semiconductor device 100 and accordingly a conductive material is easily deposited within the vias 112 to interconnect each of the redistribution layers 202 of the corresponding dice 102 of the die assemblies 201. Similarly, because the vias 112 are easily formed through the molding compound of the rims 108 damage to the semiconductor device 100 for instance before or after forming of the stacked configuration of dice 102 is thereby minimized. In contrast, drilling through the silicon of one or more of silicon dice is problematic as chipping or damage to the semiconductor within the die is a risk. One example of the molding compound 200 includes, but is not limited to, an epoxy resin including one or more additives configured to adjust the properties of the rims 108 (e.g., the package of the semiconductor device 100) to meet packaging requirements. For instance, an epoxy resin includes additives to adjust one or more of elastic modulus, coefficient of the thermal expansion, curing temperature, curing time, glass transition temperature, thermal conductivity and the like.

FIG. 3 shows a process flow diagram of a series of schematic views of one example of a process for the fabrication of a semiconductor device, such as the semiconductor device 100 shown in FIGS. 1 and 2. In a first stage 301 a plurality of dice 302 are shown in a monolithic semiconductor wafer 300. For instance, the plurality of dice 302 are formed in a silicon wafer as is previously known (by way of masking and etching of the wafer). The dice 302 in the silicon wafer 300 are probed to determine which of the dice are operable (operational dice without manufacturing or performance errors). The semiconductor wafer 300 is singulated to accordingly separate each of the dice 302. Optionally, the dice 302 are probed after singulation and then separated.

The operational dice 306 are separated from the remainder of the dice 302 and in stage 303 the operational dice 306 are positioned within a panel frame 304. As shown in FIG. 3, the panel frame 304 in one example has a substantially similar configuration to the semiconductor wafer 300 shown in stage 301. In another example as described herein the panel frame 304 has another shape, for instance a square or rectangle. The plurality of operational dice 306 are fit into the panel frame 304 and a reconstituted dice panel 308 is formed. For instance, a molding compound such as a resin or the like that hardens into a dielectric polymer is provided to the panel frame 304. The molding compound hardens around each of the operational dice 306 to accordingly form the separate die assemblies 201 shown in FIG. 2 (including the dice 102 as well as the corresponding rims 108). In the configuration shown in stage 303 the reconstituted dice panel 308 is ready for stacking for instance to form one or more of the semiconductor devices 100 previously described herein.

In another example, after forming the reconstituted dice panel (e.g., after molding of the operational dice 306) the redistribution layers 202 for each of the dice 306 are formed. For instance, making and lithography are used to etch the conductive traces of the redistribution layers 202 on the molding compound 200 and the dice 306. As previously described, the redistribution layers 202 have a fanned out configured extending over the footprint of the operational dice 306 as well as the rims 108 (e.g., see FIG. 2).

Referring now to stage 305 the reconstituted dice panels 308 are shown in an exploded configuration with each of the plurality of dice panels 310 stacked. As shown, the operation die 306 of each of the plurality of reconstituted dice panels 310 are shown in a substantially similar configuration and are accordingly aligned between each of the reconstituted dice panels 310. That is to say, the operational dice 306 of each of the dice panels 310, for instance including first and second reconstituted dice panels 312, 314, are aligned to accordingly provide a stacked semiconductor device upon separation (singulation) of the stacked dice in a later step of the process. As previously described, in one example an adhesive 204 is applied between each of the plurality of reconstituted dice panels 310 to ensure the coupling between the plurality of reconstituted dice panels 310 including the alignment of the dice therein is retained.

At stage 307 the plurality of vias 112 are formed in the stacked plurality of reconstituted dice panels 310. For instance, as shown at stage 307 the stacked panel assembly 316 includes the plurality of reconstituted dice panels 310 in a stacked and adhered configuration. Accordingly, the plurality of dice 102 (corresponding to the operational dice 306) of the panels 310 are aligned in a configuration corresponding to the arrangement of the device 100 shown in FIGS. 1 and 2. The vias 112 are formed within the rims 108 (including the redistribution layers 202 shown in FIG. 2) extending laterally away from each of the dice 102 (306 shown in FIG. 3).

In one example, the vias 112 are formed in a batch process, for instance including drilling through the rims 108 of each of the respective dice 102. That is to say, in the stacked panel assembly 316 (prior to singulation) the plurality of vias 112 are drilled through the stacked panel assembly 316 to accordingly facilitate rapid formation of the vias 112 in each of the semiconductor devices at a single manufacturing stage. In yet another example, the stacked panel assembly 316 is singulated into a plurality of the semiconductor devices 100. The plurality of separated semiconductor devices 100 are thereafter separately drilled to form the vias 112 extending through the rims 108. After formation of the vias 112 a conductive material, such as copper, is sputtered or vapor deposited within the channels of the vias 112 to electrically couple the dice 306 (e.g., through the redistribution layers 202 of the rims 108).

As shown at stage 309 the ball grid array 114 (also shown in FIGS. 1 and 2) is also provided. In a similar manner to stage 307, in one example the ball grid arrays 114 for each of the semiconductor devices 100 are formed along the semiconductor devices while still retained within the stacked panel assembly 316 shown at stage 307. Optionally the ball grid arrays 114 are formed along the semiconductor devices 100 after singulation, for instance into the semiconductor device 100 shown in stage 309.

Referring again to stage 309, the finished semiconductor device 100 is shown with the stacked dice 102 and the vias 112 extending through the rims 108. The ball grid array 114 is also shown on the bottom layer of the semiconductor device 100, for instance coupled with the redistribution layer associated with the first die 104 (as shown in FIG. 2).

The process shown in FIG. 3 schematically provides a plurality of semiconductor devices 100 such as the device shown in FIGS. 1 and 2. Because each of the panel frames 304 and the corresponding reconstituted dice panels 310 including only operational dice 306 semiconductor devices 100 including one or more damaged or faulty dice 102 are substantially avoided. That is to say, referring again to the stage 305, each of the operational dice 306 incorporated into each of the plurality of the reconstituted dice panels 310 is previously tested and known to be operational. Accordingly, the semiconductor devices 100 generated from the stacked panel assembly 316 are accordingly operational. The process shown in Figure minimizes or avoids the incorporation of faulty or damaged semiconductors relative to prior fabrication techniques, for instance using a monolithic semiconductor wafer having operational, faulty and damaged semiconductors therein. In previous fabrication techniques the faulty or damaged semiconductors are incorporated into the finished devices resulting in disposal of the entire otherwise serviceable device. Stated another way, with the process described herein one or more (e.g., a plurality of) faulty or damaged dice 302 otherwise provided in one or more of the semiconductor wafers 300 do not make their way into the otherwise fully operational semiconductor devices 100 fabricated as discussed above.

Accordingly, the yield rate of the semiconductor devices 100 is substantially higher than that of other processes using a full semiconductor wafer 300 including operational and faulty or damaged dice. In addition to the higher yield the provision of the vias 112 for instance through the rims 108 provides direct interconnection between each of the dice 102 without requiring a larger mold cap and substrate otherwise needed for wire bonded semiconductor devices. Accordingly, the semiconductor device 100 generated from the process shown in FIG. 3 has a more reliable operational character as well as a minimized vertical height (Z height) relative to other semiconductor devices formed by way of wire bond interconnections along with substrates.

Figure 4:
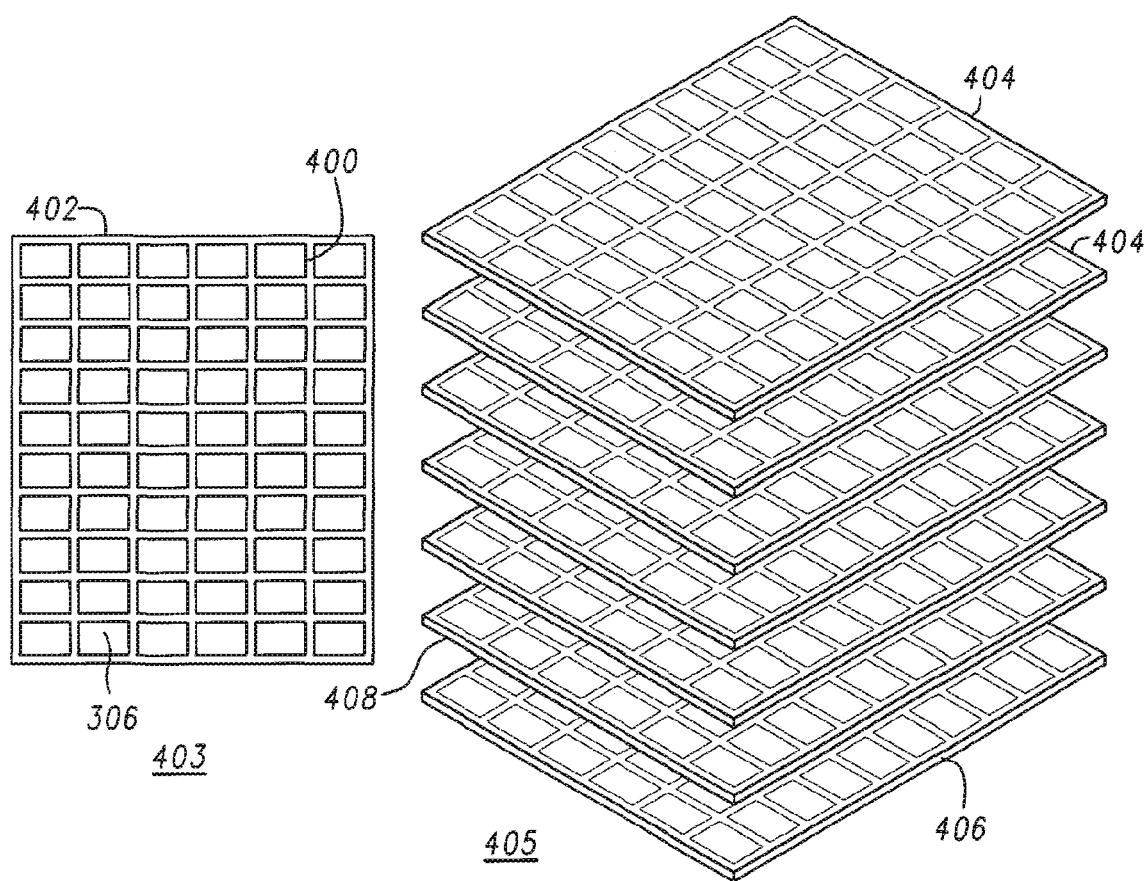
FIG. 4 is a table showing the differences in height of semiconductor devices.

Referring now to FIG. 4, two additional stages 403, 405 are provided as an alternative to the stages 303 and 305 shown in FIG. 3. For instance, the panel frame 400 shown in FIG. 4 has a square or rectangular (e.g., a non-circular) configuration relative to the wafer configuration of the panel frame 304 shown in stage 303. The panel frame 400 accordingly arranges the operational dice 306 in a grid like pattern having a square rectangular configuration. The reconstituted dice panel 402 shown in stage 403 is then stacked into a plurality of reconstituted dice panels 404 as shown at stage 405 in FIG. 4. As further shown in FIG. 4, the plurality of reconstituted dice panels 404 includes at least first and second reconstituted dice panels 406, 408.

The process previously described in FIG. 3 is then carried out in a substantially similar manner with the plurality of reconstituted dice panels 404 provided in a stacked configuration. That is to say, the vias 112 are in one example formed through the plurality of rims 108 extending laterally away from each of the dice 102. In one example, the vias 112 are formed in the rims 108 while the dice 102 are retained in the stacked configuration (e.g., prior to singulation). In a similar manner the ball grid array 114 is also applied to the first reconstituted dice panel 406 while the first reconstituted dice panel 406 of the semiconductor device 100 is retained in the stacked panel assembly as shown in FIG. 3 at stage 307. In another example, as previously described herein the vias 112 and the ball grid arrays 114 are formed on the separated semiconductor devices 100, for instance after singulation of the semiconductor device 100 from the stacked plurality of reconstituted dice panels 404.

Figure 5:
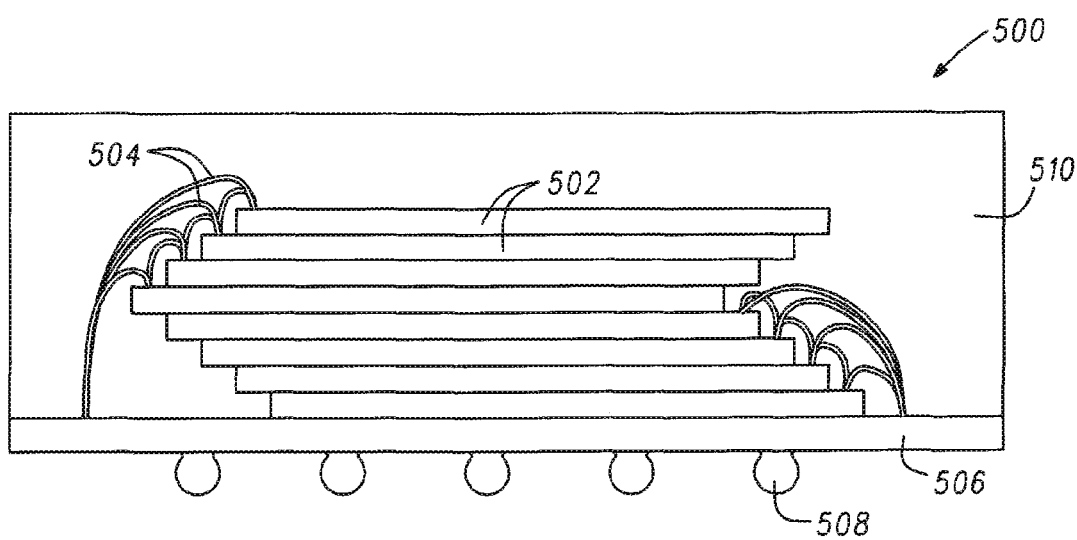
FIG. 5 is a flow chart showing one example of a method for making a multi-layered semiconductor device.

FIG. 5 shows one cross-sectional view of a semiconductor device 500 including an underlying substrate 506 and wire bonding between the dice 502 of the device 500. As further shown in FIG. 5, each of the dice 502 are connected with the substrate 506 by way of one or more wires 504 bound to each of the dice 502 and extending through the semiconductor device 500 for instance through a mold cap 510. As shown, at least some of the plurality of wires 504 provide interconnection between each of the dice 502 by first extending from the respective dice 502 to the substrate 506 (the substrate including a plurality of conductive traces) and then extending from the substrate 506 by way of additional wires 504 to one or more of the other dice 502. As further shown in FIG. 5, a ball grid array 508 is provided along the opposed surface of the substrate 506 and interconnected with the dice by way of the wires 504 extending from the substrate 506 to the dice 502.

In contrast to the assembly shown in FIG. 5, the semiconductor device 100 described herein (FIGS. 1 and 2) includes a plurality of dice 102 in a stacked configuration including a plurality of laterally extending rims 108 extending laterally (e.g., see the lateral extension 110) from each of the dice 102. The rims 108 provide a molding compound, resin or the like configured for drilling and formation of vias 112 therein. As previously described herein, each of the die assemblies 201 is formed with a redistribution layer 202, for instance to provide a fanned-out configuration of conductive traces extending beyond the horizontal footprint of each of the dice 102. Accordingly, with the vias 112 extending through the redistribution layers 202 electrical interconnections between each of the dice 102 is provided at a compact lateral location relative to the dice 102 (e.g., in the rims 108). The interconnections between the dice are provided in the lateral spaces adjacent to each of the dice 102 without otherwise requiring a large mold cap 510 to house the plurality of wires 504 of the semiconductor device 500 shown in FIG. 5. Additionally, the vias 112 extend between each of the dice 102. For instance, the vias 112 extend between two or more of the dice 102 to provide direct connections between the dice 102 and accordingly avoid an intervening substrate 506 as shown in FIG. 5.

Further, the semiconductor device 100 shown in FIGS. 1 and 2 does not need the substrate 506 for input or output to or from the device 100. Instead, the device 100 including the dice 102 interconnected with the vias 112 and the redistribution layers 202 are configured to provide input and output through the ball grid array 114 coupled along the redistribution layer 202 of the first die 104. Stated another way, the substrate 506 and the mold cap 510 as shown in FIG. 5 are not otherwise needed in the semiconductor device 100 shown in FIGS. 1 and 2. Instead, the rims 108 laterally extending from the dice 102 provide space for both the redistribution layer 202 including its conductive traces as well as the vias 112 drilled through the rims 108. Accordingly, by using the semiconductor device 100 space savings are realized vertically (Z height) relative to the semiconductor device 500 shown in FIG. 5 (requiring the larger mold cap 510 as well as the substrate 506). Additionally, the semiconductor device 100 shown in FIG. 1 includes relatively direct connections by way of the vias 112 between each of the dice 102 (without an intervening substrate 506). This arrangement provides for direct and correspondingly faster and more reliable data transmission between the dice 102 and the ball grid array 114 associated with the redistribution layer 202 of the first die 104 (see FIG. 2).

Referring now to FIG. 6, a Z height comparison table is provided for a variety of semiconductor devices having the configuration provided herein, for instance the configuration shown with the device 100 of FIGS. 1 and 2. As described herein, the semiconductor devices 100 include one or more die assemblies 201 each having a die 102, a rim 108, and one or more vias extending through the rim 108 to a redistribution layer 202. The Z heights 602 for each die assembly and the corresponding molding compound used in the rims 108 of each die assembly are shown in the rows for the Semiconductor Device with Vias in Rims of the table. The Total Z heights 602 correspond to the number of die assemblies 201 (each having a height of approximately 25 microns and 10 microns for the molding compound) stacked for a particular package type. The semiconductor devices 100 are arranged in ascending order with the first device (single die package or SDP) including a single die assembly, the second (double die package, DDP) with two die assemblies, and so on (e.g., QDP includes four assemblies, ODP includes eight assemblies and HDP includes 16 assemblies).

The corresponding Z heights 604 of the semiconductor devices including wire bonding and a substrate (see the semiconductor device 500 shown in FIG. 5) are provided in the first row of the table. As shown, the die assembly Z heights for a wire bonded device are 25 microns, and the mold cap and clearance Z heights per die assembly vary according to the number of die assemblies of the devices. The total Z heights for each of the devices is shown along the bottom row and based on the Die Assembly Z height and the Mold Cap and Clearance Z height multiplied by the number of die assemblies for the device.

As shown in FIG. 6, the Total Z heights 602 of each of the devices having a fanned out redistribution layer 202 with vias 112 in the rims 108 is smaller relative to the corresponding Total Z heights of the corresponding devices with the arrangement shown in FIG. 5 (e.g., including wire bonding, a mold cap and a substrate). The savings in Z height for each of the respective die assemblies 201 is carried forward to the stacked semiconductor devices 100 having two or more die assemblies. That is to say, a device having two more dice (e.g., die assemblies 201) with the configuration described herein multiplies the Z height savings for each of the stacked die assemblies 201 relative to the corresponding die assembly used in a package that uses wire bonding, a mold cap and a substrate.

FIG. 7 shows one example of a method 700 for making a stacked semiconductor device, such as the semiconductor device 100 previously shown herein. In describing the method 700 reference is made to one or more components, features, functions and the like described herein. Where convenient, reference is made to the components and features with reference numerals. Reference numerals are exemplary and are not exclusive. For instance, components, features, functions and the like described in the method 700 include, but are not limited to, the corresponding numbered elements, other corresponding features described herein (both numbered and unnumbered), as well as their equivalents.

At 702, the method 700 includes forming rims 108 on a first die 104 and a second die 106. The rims 108 extend laterally away from the first and second dice 104, 106. For instance, as shown in FIG. 1 the plurality of rims 108 extend from each of the respective dice according to a rim lateral extension 110.

At 704, the second die 106 is stacked over the first die 104. For instance, as shown in FIG. 2 the die assemblies 201 including, for instance, the respective dice 102 and the respective redistribution layers 202 are coupled together in a stacked configuration. In one example, stacking the dice such as the second die 106 over the first die 104 includes applying an adhesive to a surface between at least the first and second dice 104, 106 to correspondingly adhere the dice together in the stacked configuration.

At 706, one or more vias 112 are drilled through the rims 108 after stacking of the die assemblies 201 in the configuration shown in FIG. 2. The one or more vias 112 extend between at least the first and second dice 104, 106. In another example, the method 700 includes drilling the one or more vias 112 through the rims 108 prior to stacking, for instance while the plurality of dice 102 are retained within a panel frame, such as the panel frame 304 shown at stage 303 in FIG. 3. The plurality of dice 102 are then arranged in the stacked configuration with the corresponding vias 112 aligned according to the alignment of the plurality of dice 102 (e.g., dice assemblies 201) relative to one another. After drilling of the one or more vias 112 a conductive material is applied through the vias 112 for instance by vapor deposition, sputtering or plating to correspondingly interconnect the dice 102. For instance, the plurality of vias 112 provide interconnections through redistribution layers 202 associated with each of the dice 102.

Additionally, in another example the one or more vias 112 provide interconnections between the dice 102 as well as a ball grid array 114 provided along the redistribution layer 202 associated with the first die 104.

Figure 8:
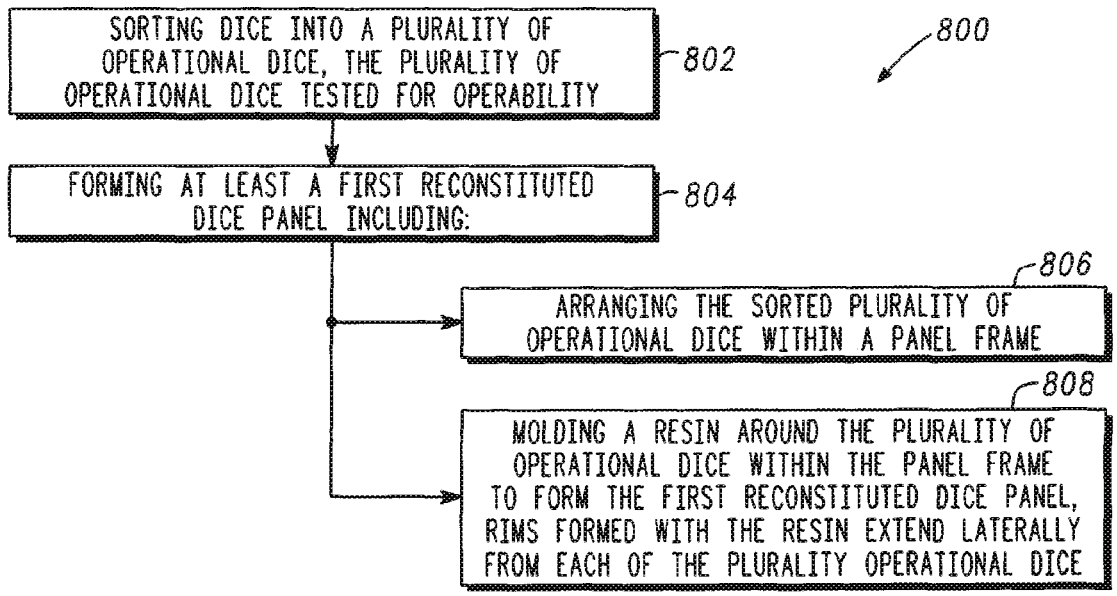
FIG. 8 is a block diagram showing yet another example of a method for making a multi-layered semiconductor device.

Referring now to FIG. 8, another example of a method 800 for making a stacked semiconductor device 100 is provided. In describing the method 800 reference is made to one or more components, features, functions and the like described herein. Where convenient reference is made to the components with reference numerals. The reference numerals provided are exemplary and are not exclusive. For instance, the features, components, functions and the like described in the method 800 include, but are not limited to, corresponding numbered elements, other corresponding features described herein (both numbered and unnumbered) as well as their equivalents.

Referring again to FIG. 8, at 802 the method 800 includes sorting dice 302 into a plurality of operational dice, such as the operational dice 306 shown at stage 303 in FIG. 3. The plurality of operational dice 306 are probed or tested to determine their operability. At 804, at least a first reconstituted dice panel 308 is formed.

In one example, forming the first reconstituted dice panel (as well as additional dice panels) includes arranging a sorted plurality of operational dice 306 within a panel frame 304 at 806. In another example, the sorted operational dice 306 are arranged within a non-circular panel frame, such as the panel frame 400 shown in FIG. 4. At 808, a resin is molded around the plurality of operational dice 306 within the panel frame 304 (or the panel frame 400) to form the first reconstituted dice panel 308. As previously described herein, rims 108 are formed within the resin and extend laterally from each of the plurality of operational dice 306.

In one example, the process for forming a reconstituted dice panel at 804 is repeated for additional dice panels to accordingly generate the plurality of reconstituted dice panels 312 or 404 shown in FIGS. 3 and 4, respectively. As previously described herein, the plurality of reconstituted dice panels are then stacked into the stacked panel assemblies 316 and the corresponding square or noncircular configuration shown in FIG. 4 to provide a stacked series of dice 102 for each of the resulting semiconductor devices 100 prior to singulation (shown at stage 309 in FIG. 3).

While in the stacked panel assembly 316, for instance shown at stage 307 of FIG. 3, a plurality of vias 112 are formed through the associated rims 108 of each of the dice assemblies 201 included in the semiconductor devices 100. For instance, while in the stacked panel assembly 316 shown at 307 the plurality of vias 112 are formed in a batch process to accordingly minimize the time needed for generation of vias 112 while the semiconductor device 100 are otherwise separated. After formation of the vias 112 the semiconductor devices 100 are singulated from the stacked panel assembly 316 to form the semiconductor devices 100 shown at stage 309 in FIG. 3 and further shown in detail in FIGS. 1 and 2.

Additionally, in another example a ball grid array 114 (shown in FIGS. 1 and 2) is provided to the first die 104 associated with each of the semiconductor devices 100 while still part of the stacked panel assembly 316. In yet another example, both of the vias 112 as well as the ball grid arrays 114 associated with each of the semiconductor devices 100 are formed after singulation of the semiconductor devices from the stacked panel assembly 316.

Figure 9:
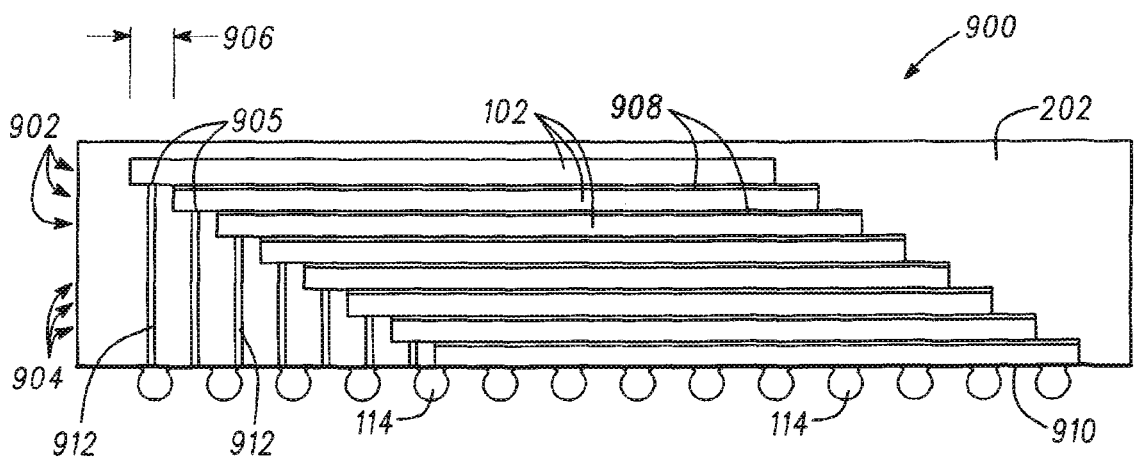
FIG. 9 is a cross sectional view of another example of a multi-layered semiconductor device including vias extending through one or more lateral rims.

FIG. 9 shows another example of a semiconductor device 900 including a plurality of dice 102 having corresponding rims 904. As shown in FIG. 9, the dice 102 are provided in a staggered configuration (e.g., a shifted or stepped configuration). For instance, each of the dice assemblies 902 is shifted relative to one another to form a staggered series of dice in the semiconductor device 900. As shown is FIG. 9, each of the dice 102 are shifted relative to one another to expose at least one face including one or more bond pads 905 of each of the dice 102. In one example, each of the dice 102 is shifted for instance according to a die shift 906 that accordingly staggers the respective die relative to an adjacent die. In another example, the dice 102 are shifted varying degrees (and optionally in different directions) to accordingly expose one or more bond pads 905 according to the shifting. That is to say, one or more of the dice 102 are shifted one or more of a greater or lesser degree or in a differing direction according to the positions of the respective bond pads 905.

As shown in FIG. 9, each of the dice are staggered in the same direction providing a staggered configuration (stair stepped) to accordingly expose the corresponding bond pads 905 of each of the dice 102 (excepting the bottom most die 102 of the semiconductor device 900). As previously described herein each of the dice 102 are incorporated into respective die assemblies 902. As shown, each of the die assemblies 902 include a die 102 as well as one or more corresponding rims 904 for each of the dice 102.

As further shown in FIG. 9, each of the plurality of dice 102 are bonded with one another, for instance, with an adhesive 908 provided on the surfaces facing the adjacent dice 102. The adhesive 908 retains each of the dice 102 in the staggered configuration and accordingly retains the die shift 906 as shown in FIG. 9 (one example of a die shift) to thereby maintain the bond pads 905 in an exposed configuration for eventual interconnection. In one example, the plurality of dice 102 are bonded together with the adhesive 908 prior to the application of a molding compound, such as the molding compound 200 previously shown in FIG. 2. As previously described the molding compound 202 cures into a dielectric polymer and correspondingly provides the rims 904 for each of the die assemblies 902. After adhesion of each of the dice 102 the molding compound 202 is applied around the stacked dice 102 to accordingly form an intermediate stage of the semiconductor device 900.

One or more vias 912 are drilled through one or more of the rims 904 to accordingly provide interconnection between the dice 102 and a corresponding redistribution layer 910 associated with one or more of the dice 102 (e.g., the bottom most die shown in FIG. 9) adjacent to the ball grid array 114. As shown in FIG. 9 each of the vias 912 couple with the corresponding bond pads 905 for the respective overlying dice 102. The plurality of vias 912 associated with each of the dice 102 correspondingly extend from the bond pads 905 through one or more of the rims 904 associated with the corresponding die assemblies 902. That is to say, the top most die 102 of the semiconductor device 900 includes one or more vias 912 extending through the respective rims of the underlying dice 102.

After formation of the vias 912 (e.g., by mechanical drilling, lithography, laser drilling or the like) a redistribution layer 910 similar to the redistribution layer 202 shown in FIG. 2 is provided for at least one of the dice 102, such as the die 102 corresponding to the bottom of the semiconductor device 900 adjacent to the ball grid array 114. In one example the redistribution layer 910 provides a fanned out configuration of conductive traces extending over the footprint of the die 102 as well as the corresponding overall footprint of the stacked dice 102. That is to say, as shown in FIG. 9 the redistribution layer 910 extends beneath each of the dice 102 and provides conductive traces for interconnection with the vias 912 extending from the respective bond pads 905 of each of the dice 102 through the rims 904. In another example, after formation of the redistribution layer 910 the ball grid array 114 is applied to the semiconductor device 900 along the redistribution layer 910 to provide input and output connections for the semiconductor device 900.

Figure 10:
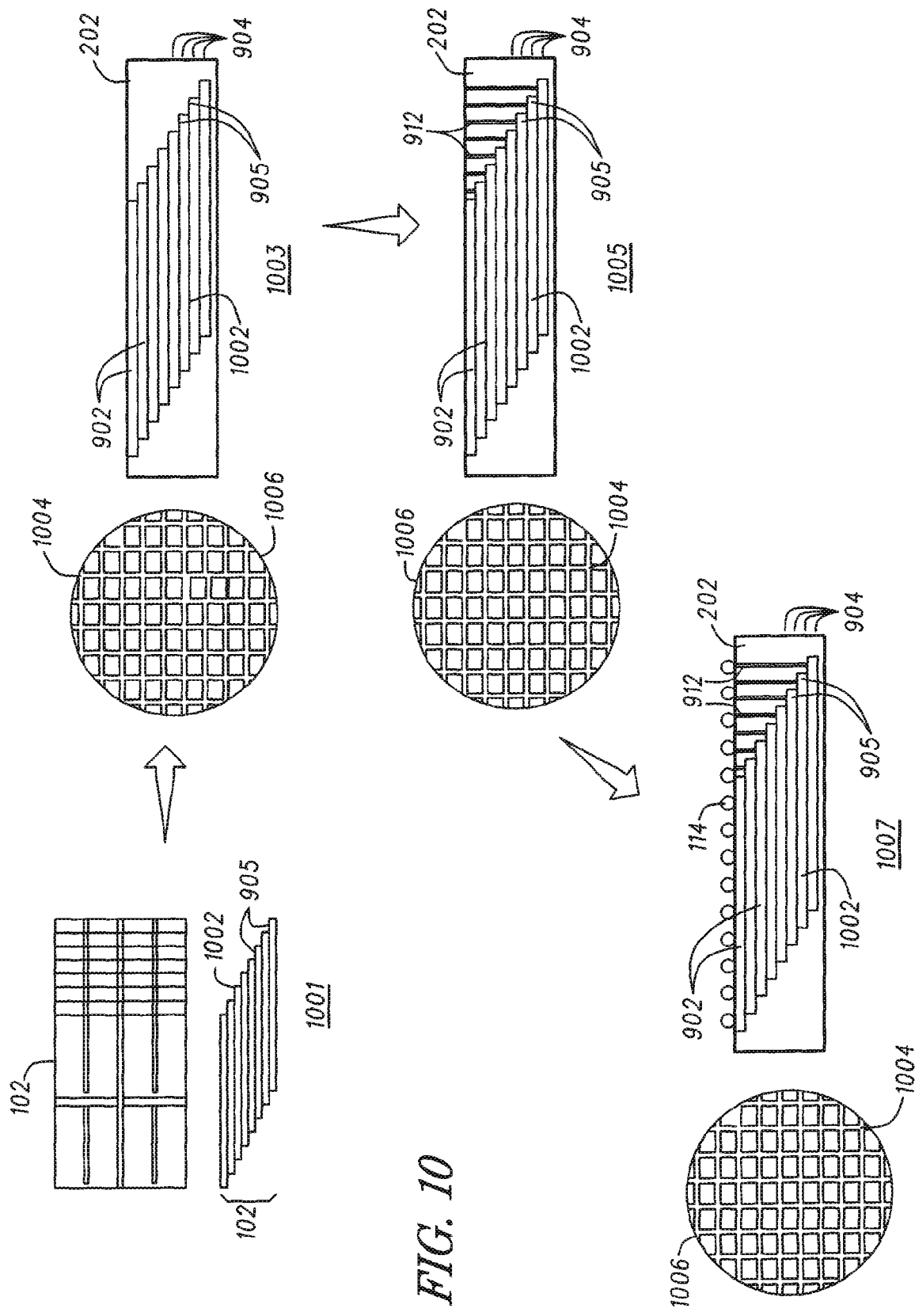
FIG. 10 is a flow chart showing another example of a method for making a multi-layered semiconductor device.

Referring now to FIG. 10, another example of a method for forming a semiconductor (e.g., the semiconductor device 900 shown in FIG. 9) is provided. As with the method previously described and shown in FIG. 5 the method is shown in a series of schematic stages 1001, 1003, 1005, 1007. At 1001 a plurality of dice 102 singulated from one or more monolithic semiconductor wafers are tested for operability. The operational dice 102 (without faults or damage) are then assembled into a dice stack 1002. For instance, the dice 102 of one or more dice stacks 1002 are adhered. As shown at stage 1001 the dice stack 1002 has a staggered configuration (stepped, shifted or the like) that correspondingly exposes the bond pads 905 of at least one surface of each the dice 102 of the dice stack 1002. As described above, in another example, the dice 102 are shifted one or more of varying degrees or directions according to the location and number of the respective bond pads 905.

Referring now to stage 1003 in FIG. 10 each of the dice stacks 1002 is positioned within a panel frame 1004 including a series of cavities sized and shaped to receive each of the dice stacks 1002. After positioning of the die stacks 1002 within the cavities of the panel frame 1004 a molding compound is applied around the plurality of dice stacks 1002 within the panel frame 1004 to form the rims 904 of the die assemblies 902 previously shown in FIG. 9. As described herein, in one example, the molding compound 202 is a resin that forms a dielectric polymer having a lower modulus of elasticity compared to the material of the dice (e.g., silicon). The panel frame 1004 in combination with forms a reconstituted dice panel 1006 including a plurality of the molded dice stacks therein. Stage 3 shows a circular (wafer shaped) panel frame 1004. In another example, the panel frame has a different shape such as the rectangle or square shown in FIG. 4.

As shown in stage 1003, the die assemblies 902 formed by the dice stack 1002 include the rims 904 extending laterally from each of the dice 102. As shown in this configuration the dice stack 1002 is staggered within the molding compound 202. Each of the rims 904 for the respective dice 102 correspondingly vary in the lateral dimension according to the shifted location of the each of the dice 102 within the dice stack 1002. The bond pads 905 exposed through the shifting of the dice face the bottom (as presented in FIG. 10) of the dice stack 1002 toward the rims 904 of the underlying dice 1002.

At stage 1005, a plurality of vias 912 are drilled into the rims 904 underlying the bond pads 905 to interconnect each of the dice 102 with a redistribution layer 910 provided along one of the dice 102. For instance, in the example shown in FIG. 10 the bottom most die (shown as the top most die in this inverted configuration) is provided with the redistribution layer 910. Optionally, prior to forming the conductive traces of the redistribution layer 910 the plurality of vias 912 are drilled into the rims 904 to accordingly form the passages that will receive conductive material to interconnect with the later formed redistribution layer 910. A conductive material is applied to the channels of the vias 912 to eventually interconnect the plurality of dice 102 of the die stack 1002 with the redistribution layer of the semiconductor device 900. In another example, the redistribution layer 910 is formed prior to drilling of the vias 912.

At stage 1007 the semiconductor device 900 is finished by applying a ball grid array 114 to the redistribution layer 910 previously formed at stage 1005. As shown at stage 1007 the semiconductor device 900 is then singulated from the reconstituted dice panel 1006. A plurality of semiconductor devices 900 are singulated from the same reconstituted dice panel 1006.

As with the previously described semiconductor device 100 the semiconductor device 900 shown in FIGS. 9 and 10 provides direct connections with a redistribution layer 910 for instance a redistribution layer 910 associated with the bottom most die 102 and the die stack 1002. The plurality of vias 912 provide direct connection with the redistribution layer 910 without requiring an otherwise larger mold cap to accordingly contain and encapsulate a plurality of wire bonds extending from each of the dice to a substrate (larger than the redistribution layer 910) underneath the dice stack. The staggered configuration of the dice stack 1002 exposes the bond pads 905 of one or more of the dice 102 and thereby allows for the vias 912 extending from the bond pads 905 through the rims 904 to interconnect each of the respective dice 102 with the redistribution layer 910. The direct connections provided by the vias 912 between the bond pads 905 and the redistribution layer allows for a shallow layer of molding compound compared to the otherwise deeper (thicker) mold cap needed to reliably encapsulate wires, such as the 504 shown in FIG. 5.

Additionally and as previously described by providing the vias 912 through the molding compound 202 (a dielectric polymer) damage to the semiconductor device 900 is minimized as drilling through the semiconductor device 900 is conducted through the softer material (lower elastic modulus) of the molding compound 202 compared to the harder material of the silicon of the dice 102. Additionally, with the method shown in FIG. 10 the process of forming the redistribution layer 910 is isolated to one of the dice 102 of the dice stack 1002. For instance, as described herein the redistribution layer 910 is provided to the bottom most die 102 of the die stack 1002. Accordingly the vias 912 extend through the lateral rims 904 of the dice 102 of the dice stack 1002 to the redistribution layer 910 associated with the bottom most die 102. The redistribution layer 910 thereby consolidates the interconnections of each of a plurality of redistribution layers otherwise associated with each of the dice 102 into a single redistribution layer that also provides interconnections with the ball grid array 114. In another example, the bottom most die 102 includes a plurality of redistribution layers (e.g., multiple adjacent layers 910) that are localized to the die while the remainder of the dice 102 overlying the bottom most die 102 are interconnected with the vias 912. In still another example, each of the dice 102 includes a respective redistribution layer 910 and the dice 102 are interconnected through the redistribution layers 910 with the vias 912.

Figure 11:
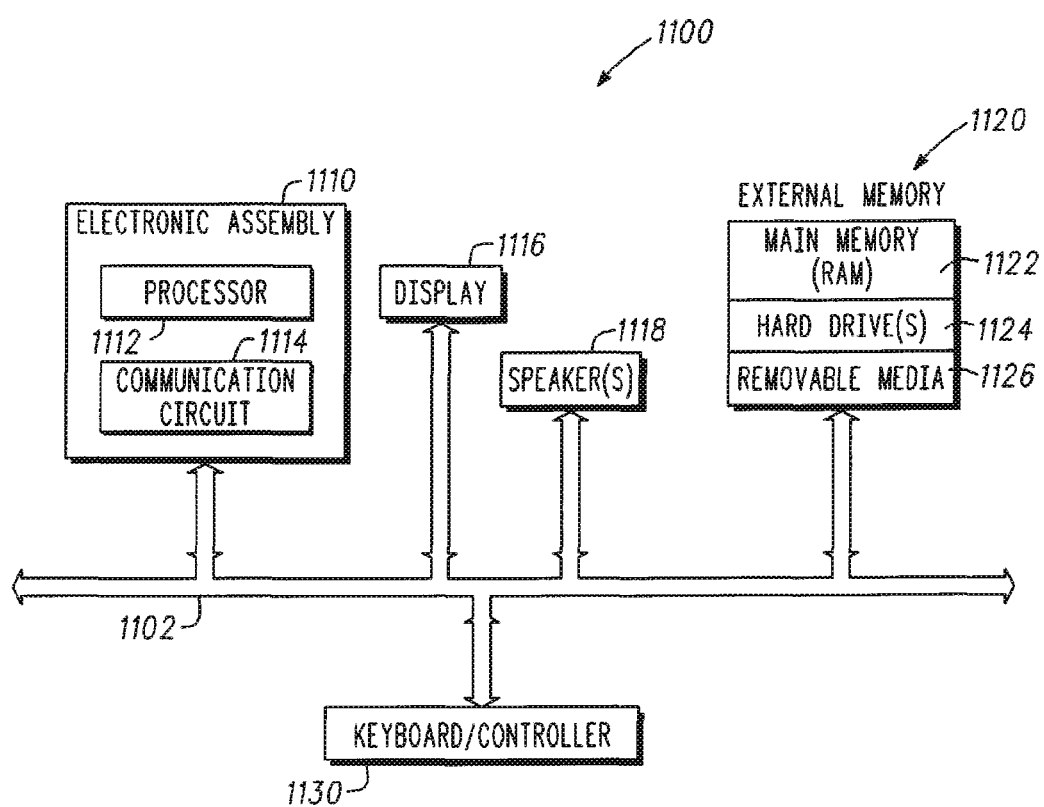
FIG. 11 is a schematic diagram of an electronic system in accordance with some embodiments of the disclosure.

An example of an electronic device using semiconductor devices 100, 900 as described in the present disclosure is included to show an example of a higher level device application for the present disclosure. FIG. 11 is a block diagram of an electronic device 1100 incorporating at least one semiconductor device constructed with the fabrication methods and structure in accordance with at least one embodiment of the disclosure. The electronic device 1100 is merely one example of an electronic system in which embodiments of the present disclosure are used. Examples of electronic devices 1100 include, but are not limited to, personal computers, tablet computers, mobile telephones, game devices, MP3 or other digital music players, etc. In this example, the electronic device 1100 comprises a data processing system that includes a system bus 1102 to couple the various components of the system. System bus 1102 provides communication links among the various components of the electronic device 1100 and can be implemented as a single bus, as a combination of busses, or in any other suitable manner.

An electronic assembly 1110 is coupled to system bus 1102. The electronic assembly 1110 can include any circuit or combination of circuits. In one embodiment, the electronic assembly 1110 includes a processor 1112 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in the electronic assembly 1110 are a custom circuit, an application-specific integrated circuit (ASIC), or the like, such as, for example, one or more circuits (such as a communications circuit 1114) for use in wireless devices like mobile telephones, personal data assistants, portable computers, two-way radios, and similar electronic systems. The IC can perform any other type of function.

The electronic device 1100 (for instance a drive such as a Solid State Drive or flash memory) can also include an external memory 1120, which in turn can include one or more memory elements suitable to the particular application, such as a main memory 1122 in the form of random access memory (RAM), one or more hard drives 1124, or one or more drives that handle removable media 1126 such as compact disks (CD), flash memory cards, digital video disks (DVD), and the like.

The electronic device 1100 can also include one or more of a display device 1116, one or more speakers 1118, a keyboard or controller 1130, which may optionally include a mouse, trackball, touch screen, voice-recognition device, or any other device that permits a system user to input information into and receive information from the electronic device 1100.

To better illustrate the method and apparatuses disclosed herein, a non-limiting list of embodiments is provided here:

Example 1 is an apparatus for a method for making a stacked semiconductor device comprising: forming rims on a first die and a second die, the rims extending laterally away from the first and second dice; stacking the second die over the first die; and drilling one or more vias through the rims after stacking, the one or more vias extending between the first and second dice.

In Example 2, the subject matter of Example 1 can optionally include filling the one or more vias with a conductive material to electrically interconnect the first and second dice.

In Example 3, the subject matter of any one of examples 1-2 can optionally include wherein forming rims includes forming a dielectric portion over the first die and the second die, the rims formed with the dielectric portion.

In Example 4, the subject matter of any one of examples 1-3 can optionally include wherein forming the dielectric portion includes molding resin around the first die and the second die, the rims formed with the resin.

In Example 5, the subject matter of any one of examples 1-4 can optionally include forming a first reconstituted dice panel including a first plurality of dice molded in a panel frame, the first plurality of dice including the first die, and forming a second reconstituted dice panel including a second plurality of dice molded in another panel frame, the second plurality of dice including the second die; and forming rims includes surrounding a periphery of the dice in the first and second reconstituted dice panels with a dielectric material.

In Example 6, the subject matter of any one of examples 1-5 can optionally include sorting the dice in the first plurality of dice and second plurality of dice to ensure only operational dice are used to form the first and second reconstituted dice panels.

In Example 7, the subject matter of any one of examples 1-6 can optionally include separating individual stacks of first and second adhered dice from the first and second reconstituted dice panels.

In Example 8, the subject matter of any one of examples 1-7 can optionally include wherein drilling the one or more vias consists of one or more of laser drilling, mechanical drilling or chemical etching.

In Example 9, the subject matter of any one of examples 1-8 can optionally include wherein drilling the one or more vias is continuous through the first and second dice.

In Example 10, the subject matter of any one of examples 1-9 can optionally include forming one or more redistribution layers of conductive traces over one or more of the first or second dice or the rims, the one or more vias in communication with the conductive traces at the rims.

In Example 11, the subject matter of any one of examples 1-10 can optionally include wherein stacking the first die over the second die includes staggering the second die relative to the first die to expose at least one bond pad of the second die.

In Example 12, the subject matter of any one of examples 1-11 can optionally include wherein drilling the one or more vias includes drilling at least one via through the rim of the first die, the at least one via extending to the at least one bond pad of the second die.

In Example 13, the subject matter of any one of examples 1-12 can optionally include A method for making a stacked semiconductor device comprising: sorting dice into a plurality of operational dice, the plurality of operational dice tested for operability; and forming at least a first reconstituted dice panel including: arranging the sorted plurality of operational dice within a panel frame, and molding a resin around the plurality of operational dice within the panel frame to form the first reconstituted dice panel, rims formed with the resin extend laterally from each of the plurality operational dice.

In Example 14, the subject matter of any one of examples 1-13 can optionally include repeating arranging and molding to form a second reconstituted dice panel, rims extend laterally away from each die of the plurality of operational dice of the second reconstituted dice panel.

In Example 15, the subject matter of any one of examples 1-14 can optionally include coupling the first reconstituted dice panel to the second reconstituted dice panel; and drilling one or more vias in the coupled first and second reconstituted dice panels, the one or more vias within the rims of the plurality of operational dice and the one or more vias extend between the first and second reconstituted dice panels.

In Example 16, the subject matter of any one of examples 1-15 can optionally include wherein coupling the first reconstituted dice panel to the second reconstituted dice panel includes aligning the pluralities of operational dice of each of the first and second reconstituted dice panels.

In Example 17, the subject matter of any one of examples 1-16 can optionally include separating the first and second reconstituted dice panels into a plurality of multi-layered packages, each of the multi-layered packages including: at least two dice of the plurality of operational dice of the first and second reconstituted dice panels, and at least one via of the one or more vias.

In Example 18, the subject matter of any one of examples 1-17 can optionally include wherein drilling one or more vias in the coupled first and second reconstituted dice panels includes drilling one or more vias through the rims of the plurality of operational dice.

In Example 19, the subject matter of any one of examples 1-18 can optionally include filling the one or more vias with a conductive material to electrically couple the first and second reconstituted dice panels.

In Example 20, the subject matter of any one of examples 1-19 can optionally include wherein forming at least the first reconstituted dice panel includes forming one or more redistribution layers of conductive traces over the plurality of operational dice and the respective rims, the one or more vias in communication with the conductive traces at the rims.

In Example 21, the subject matter of any one of examples 1-20 can optionally include wherein arranging the sorted plurality of operational dice within the panel frame includes arranging the sorted plurality of operational dice into one or more staggered stacks of dice within the panel frame, each of the one or more staggered stacks of dice including two or more dice and at least one of the two or more dice is staggered relative to an adjacent die.

In Example 22, the subject matter of any one of examples 1-21 can optionally include wherein molding the resin around the plurality of operation dice includes molding the resin around each of the one or more staggered stacks of dice.

In Example 23, the subject matter of any one of examples 1-22 can optionally include a semiconductor device comprising: a first die; a second die stacked over the first die; rims extending laterally away from each of the first and second dice; a first redistribution layer extending over the first die and the rim of the first die; and one or more vias extending through at least one of the respective rims, the one or more vias in communication with the first and second dice through the rims.

In Example 24, the subject matter of any one of examples 1-23 can optionally include wherein the respective rims are molded resin rims molded around the respective first and second dice, the one or more vias extend through at least one of the molded resin rims.

In Example 25, the subject matter of any one of examples 1-24 can optionally include dielectric portions formed over each of the first and second dice, the dielectric portions including the one or more rims, and the one or more vias extend through the dielectric portions.

In Example 26, the subject matter of any one of examples 1-25 can optionally include wherein the one or more vias are laterally spaced from the first and second dice.

In Example 27, the subject matter of any one of examples 1-26 can optionally include a second redistribution layer extending over the second die and the rim of the second die.

In Example 28, the subject matter of any one of examples 1-27 can optionally include the first and second redistribution layers provide a fan-out configuration of conductive traces extending over and beyond respective footprints of the first and second dice, and the one or more vias are in communication with the first and second redistribution layers.

In Example 29, the subject matter of any one of examples 1-27 can optionally include wherein the vias are drilled vias formed in at least one of the respective rims after stacking of the second die over the first die.

In Example 30, the subject matter of any one of examples 1-29 can optionally include a plurality of dice including the first and second dice, rims extend laterally from each of the plurality of dice, the plurality of dice are in a stacked configuration, and the one or more vias extend through at least two of the respective rims of the plurality of dice.

In Example 31, the subject matter of any one of examples 1-30 can optionally include wherein the second die is staggered relative to the first die, the second die include at least one exposed bond pad according to the staggering.

In Example 32, the subject matter of any one of examples 1-31 can optionally include wherein the one or more vias extend through the rim of the first die to the at least one exposed bond pad of the second die.

Each of these non-limiting examples can stand on its own, or can be combined in any permutation or combination with any one or more of the other examples.

The above detailed description includes references to the accompanying drawings, which form a part of the detailed description. The drawings show, by way of illustration, specific embodiments in which the disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the disclosure should be determined with reference to the appended claims, along with the full scope of equivalents to which such claims are entitled.

The invention claimed is:

1. An electronic device comprising:
   a processor having one or more processor integrated circuits, wherein the one or more processor integrated circuits include at least one semiconductor assembly having:
      a first die assembly including:
         a first die having a first die surface;
         a first rim molded around the first die, the first rim having a first rim exterior surface flush with the first die surface; and
         a plurality of first conductive traces in a first fan-out configuration extending along the first rim exterior surface and in electrical communication with the first die;
      a second die assembly stacked over the first die assembly, the second die assembly, including:
         a second die having a second die surface;
         a second rim molded around the second die, the second rim having a second rim exterior surface flush with the second die surface; and
         a plurality of second conductive traces in a second fan-out configuration extending along the second rim exterior surface and in electrical communication with the second die; and
      one or more conductive vias extending through the first or second rims, the one or more conductive vias and the first and second pluralities of conductive traces electrically interconnecting the first and second dice;
   a display electrically interconnected with the processor; and
   an input controller electrically interconnected with the processor.

2. The electronic device of claim 1 comprising:
   a memory having one or more memory integrated circuits;
   a system bus interconnecting two or more of the processor, memory, display and the input controller; and
   wherein the one or more processor integrated circuits and the one or more memory integrated circuits each include at least one of the semiconductor assemblies.

3. The electronic device of claim 1, wherein the input controller is a keyboard.

4. The electronic device of claim 1, wherein the plurality of first conductive traces are patterned over the first rim exterior surface and the first die surface; and
   the plurality of second conductive traces are patterned over the second rim exterior surface and the second die surface.

5. The electronic device of claim 1 comprising dielectric portions formed over each of the first and second dice, the dielectric portions including the respective first and second rims, and the one or more conductive vias extend through the dielectric portions.

6. The electronic device of claim 1, wherein the one or more conductive vias continuously extend from the first rim to the second rim.

7. The electronic device of claim 1, wherein the first or second rims extends over the first or second dice, respectively.

8. The electronic device of claim 1, wherein the first or second die is laterally staggered relative to the other of the second or first die.

9. The electronic device of claim 1 comprising a ball grid array coupled with the first die assembly, and electrically interconnected with the first and second dice with the first and second pluralities of conductive traces and the one or more conductive vias.

10. An electronic device comprising:
    a processor having one or more processor integrated circuits, wherein the one or more processor integrated circuits include at least one semiconductor assembly having:
       a first die assembly including:
          a first die; and
          a first rim molded around the first die, the first rim extends laterally from the first die, wherein the first rim includes a first upper rim face and a first lower rim face;
       a second die assembly bonded with the first die assembly, the second die assembly includes:
          a second die;
          a second rim molded around the second die, the second rim extends laterally from the second die, wherein the second rim includes a second upper rim face and a second lower rim face; and
          a plurality of conductive traces extending from the second die laterally along one or more of the second upper or second lower rim faces;
       wherein the second lower rim face of the second die assembly is bonded to the first upper rim face of the first die assembly with the plurality of conductive traces therebetween; and
       one or more conductive vias extending through at least one of the first or second rims, the one or more conductive vias electrically coupled with one or more conductive traces of the plurality of conductive traces;
    a display electrically interconnected with the processor; and
    an input controller electrically interconnected with the processor.

11. The electronic device of claim 10 comprising:
    a memory having one or more memory integrated circuits;
    a system bus interconnecting two or more of the processor, memory, display and the input controller; and
    wherein the one or more processor integrated circuits and the one or more memory integrated circuits each include at least one of the semiconductor assemblies.

12. The electronic device of claim 10, wherein bonding includes adhering the second lower rim face to the first upper rim face.

13. The electronic device of claim 10, wherein the one or more conductive vias are laterally spaced from the first and second dice.

14. The electronic device of claim 10, wherein the plurality of conductive traces provide a fan-out configuration of conductive traces extending beyond a footprint of the second die.

15. The electronic device of claim 10, wherein the first or second rim extends over the first or second dice, respectively.

16. The electronic device of claim 10, wherein at least a first portion of the plurality of conductive traces underlies the second die, and a second portion of the plurality of conductive traces underlies the second rim.

17. The electronic device of claim 10, wherein a first die lower surface of the first die is flush with the first lower rim face, and a second die lower surface of the second die is flush with the second lower rim face.

18. The electronic device of claim 10 comprising another plurality of conductive traces extending from the first die laterally along one or more of the first upper or first lower rim faces.

19. An electronic device comprising:
a processor having one or more processor integrated circuits, wherein the one or more processor integrated circuits include at least one semiconductor assembly having:
    a first die assembly including:
        a first die having a first die upper surface and a first die lower surface; and
        a first rim extending laterally from the first die, wherein the first rim includes a first upper rim face proximate the first die upper surface and a first lower rim face proximate the first die lower surface;
    a second die assembly over the first die assembly, the second die assembly including:
        a second die, having a second die upper surface and a second die lower surface;
        a second rim extending laterally away from the second die, wherein the second rim includes a second upper rim face proximate the second die upper surface and a second lower rim face proximate the second die lower surface; and
        a plurality of conductive traces extending outwardly beyond the second die toward the second lower rim face;
        wherein at least the second lower rim face is a bottom most surface of the second die assembly, and the plurality of conductive traces are interposed between the first upper rim face and the second lower rim face; and
    one or more vias extending through at least one of the first and second rims, the one or more vias in communication with the first and second dice through the plurality of conductive traces;
a display electrically interconnected with the processor; and
an input controller electrically interconnected with the processor.

20. The electronic device of claim 19 comprising:
a memory having one or more memory integrated circuits;
a system bus interconnecting two or more of the processor, memory, display and the input controller; and
wherein the one or more processor integrated circuits and the one or more memory integrated circuits each include at least one of the semiconductor assemblies.

21. The electronic device of claim 19, wherein at least the first upper rim face is an upper most surface of the first die assembly.

22. The electronic device of claim 19, wherein the first and second rims are molded resin extending around the respective first and second dice.

23. The electronic device of claim 19, wherein the first die assembly includes another plurality of conductive traces extending outwardly beyond the first die and toward the first rim.

24. The electronic device of claim 19, wherein the second lower rim face and the second die lower surface of the second die are flush.

25. The electronic device of claim 19, wherein at least a first portion of the plurality of conductive traces underlies the second die, and a second portion of the plurality of conductive traces underlies the second rim.

* * * * *